(12) United States Patent
Jung et al.

(10) Patent No.: US 10,957,245 B2
(45) Date of Patent: Mar. 23, 2021

(54) DISPLAY APPARATUS HAVING OPPOSING DISPLAY MODULES OF MICRO LEDS

(71) Applicant: SAMSUNG ELECTRONICS CO., LTD., Suwon-si (KR)

(72) Inventors: Chulgyu Jung, Suwon-si (KR); Jinho Kim, Suwon-si (KR); Sangmin Shin, Suwon-si (KR); Hoseop Lee, Suwon-si (KR); Youngki Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/706,093

(22) Filed: Dec. 6, 2019

(65) Prior Publication Data

US 2020/0184880 A1 Jun. 11, 2020

(30) Foreign Application Priority Data

Dec. 6, 2018 (KR) .................. 10-2018-0156304

(51) Int. Cl.
  *G09G 3/32* (2016.01)
  *G06F 3/14* (2006.01)
  *H01L 25/16* (2006.01)

(52) U.S. Cl.
  CPC ............. *G09G 3/32* (2013.01); *G06F 3/1446* (2013.01); *H01L 25/167* (2013.01); *G09G 2300/026* (2013.01)

(58) Field of Classification Search
  CPC .. G09G 3/32; G09G 2300/026; G06F 3/1446; H01L 25/167
  See application file for complete search history.

(56) References Cited

U.S. PATENT DOCUMENTS

| 7,905,618 B2 | 3/2011 | Kim et al. |
| 8,220,944 B2 | 7/2012 | Kim et al. |
| 8,764,212 B2 | 7/2014 | Kim et al. |
| 9,024,936 B2 | 5/2015 | Ogata et al. |

(Continued)

FOREIGN PATENT DOCUMENTS

| KR | 10-2003-0088835 A | 11/2003 |
| KR | 10-2009-0009120 A | 1/2009 |

(Continued)

OTHER PUBLICATIONS

International Search Report (PCT/ISA/210) dated Mar. 20, 2020 issued by the International Searching Authority in International Application No. PCT/KR2019/016649.

(Continued)

*Primary Examiner* — Temesghen Ghebretinsae
*Assistant Examiner* — Ivelisse Martinez Quiles
(74) *Attorney, Agent, or Firm* — Sughrue Mion, PLLC

(57) ABSTRACT

A display apparatus including: a printed circuit board; and a plurality of display modules arranged adjacent in a length direction of the printed circuit board, each display modules of the plurality of the display modules including: a thin film transistor substrate; a plurality of micro LEDs arranged on a surface of the thin film transistor substrate; a flexible printed circuit board (FPCB) through which the printed circuit board and the thin film transistor substrate; and a driver controlling the plurality of micro LEDs disposed on a surface of the FPCB.

15 Claims, 12 Drawing Sheets

(56) References Cited

U.S. PATENT DOCUMENTS

| | | |
|---|---|---|
| 9,519,184 B2 | 12/2016 | Kim et al. |
| 9,997,096 B2 | 6/2018 | Shin |
| 9,997,688 B2 | 6/2018 | Takeya et al. |
| 10,522,081 B2 | 12/2019 | Kim et al. |
| 2007/0001927 A1 | 1/2007 | Ricks et al. |
| 2009/0021932 A1 | 1/2009 | Kim et al. |
| 2009/0168399 A1 | 7/2009 | Kim et al. |
| 2011/0026241 A1 | 2/2011 | Kim et al. |
| 2012/0127405 A1* | 5/2012 | Lee ............ G02F 1/13452 349/106 |
| 2012/0287021 A1 | 11/2012 | Park et al. |
| 2014/0184670 A1* | 7/2014 | Jeong ............ G09G 3/3666 345/694 |
| 2014/0313696 A1 | 10/2014 | Kim et al. |
| 2015/0339967 A1* | 11/2015 | Shin ............ G09G 3/3406 345/690 |
| 2017/0250329 A1 | 8/2017 | Takeya et al. |
| 2018/0174519 A1* | 6/2018 | Kim ............ H01L 33/42 |
| 2018/0181252 A1 | 6/2018 | Park et al. |
| 2018/0182288 A1* | 6/2018 | Kim ............ G09G 3/3291 |
| 2018/0190747 A1* | 7/2018 | Son ............ H01L 27/3267 |
| 2018/0287030 A1 | 10/2018 | Takeya et al. |
| 2020/0083422 A1 | 3/2020 | Takeya et al. |

FOREIGN PATENT DOCUMENTS

| | | |
|---|---|---|
| KR | 10-2015-0134167 A | 12/2015 |
| KR | 10-2018-0071062 A | 6/2018 |
| KR | 10-2018-0077411 A | 7/2018 |
| KR | 10-2018-0077412 A | 7/2018 |
| WO | 2017/146477 A1 | 8/2017 |

OTHER PUBLICATIONS

Written Opinion (PCT/ISA/237) dated Mar. 20, 2020 issued by the International Searching Authority in International Application No. PCT/KR2019/016649.

* cited by examiner

DISPLAY APPARATUS HAVING OPPOSING DISPLAY MODULES OF MICRO LEDS

CROSS-REFERENCE TO RELATED APPLICATION(S)

This application is based on and claims priority under 35 U.S.C. § 119 to Korean Patent Application No. 10-2018-0156304, filed on Dec. 6, 2018, in the Korean Intellectual Property Office, the disclosure of which is incorporated by reference herein in its entirety.

BACKGROUND

Field

The disclosure relates to a display apparatus having a simplified manufacturing process and improved signal efficiency.

Description of the Related Art

A micro light emitting diode (LED) is a microminiature inorganic light emitting structure that emits light without a color filter and a backlight. For example, the micro LED may refer to a microminiature LED having one tenth the length, one hundredth the area of a conventional light emitting diode (LED) chip, and size dimensions of 10 to 100 micrometers (μm) in width, length and height.

The micro LEDs may be arranged on thin film transistors and controlled to be operated by a plurality of the thin film transistors.

Such a thin film transistor substrate may be used for driving a display of various sizes, which may include devices in the form of a flexible device, a small wearable device (such as a wearable watch, etc.), and a large TV having a size of tens of inches. To be driven, the thin film transistor substrate may be connected to an external integrated circuit (IC) or a driver IC, which may apply current to the thin film transistor substrate.

Such external ICs or driver ICs may be arranged on rear surfaces of a plurality of thin film transistor substrates to reduce seams between the plurality of thin film transistor substrates.

Here, vias may be formed in the thin film transistor substrates to electrically connect the micro LEDs on the plurality of thin film transistor substrates and the external ICs or the driver ICs on the rear surfaces of the plurality of thin film transistor substrates to each other, respectively. However, this manufacturing process is complicated and has low manufacturing reliability.

SUMMARY OF THE INVENTION

Embodiments of the disclosure overcome the above disadvantages and other disadvantages not described above. Also, the disclosure is not required to overcome the disadvantages described above, and an embodiment of the disclosure may not overcome any of the problems described above.

The disclosure provides a display apparatus having a simplified manufacturing process and improved signal efficiency.

According to an embodiment in the disclosure, there is provided a display apparatus including a printed circuit board; and a plurality of display modules arranged adjacent in a first length direction of the printed circuit board, in which each display module of the plurality of display modules may include: a thin film transistor substrate; a plurality of micro light emitting diodes (LEDs) arranged on a surface of the thin film transistor substrate; a flexible printed circuit board (FPCB) connecting the printed circuit board to the thin film transistor substrate; and a driver controlling the plurality of micro LEDs, the driver being disposed on a surface of the FPCB.

A shape of the thin film transistor substrate may be rectangular including a first side surface, a second side surface, a third side surface, and a fourth side surface, the first side surface being disposed adjacent to the flexible printed circuit board, and a third length of the third side surface and a fourth length of the fourth side surface is longer than a first length of the first side surface and a second length of the second side surface.

The third side surface of each display module of the plurality of display modules may be arranged parallel to each other, respectively.

The third side surface of a first display module among the plurality of display modules may be in contact with the fourth side surface of a second display module among the plurality of display modules adjacent to the first display module.

The display apparatus may further include a timing controller configured to provide an image signal to the driver of each display module among the plurality of display modules.

The timing controller may be disposed behind the plurality of display modules.

The timing controller may be disposed at a center portion of the plurality of display modules.

Each port of a plurality of ports of the timing controller is connected to the driver of each display module of the plurality of display modules through electrical paths and the timing controller is disposed to minimize a sum of lengths of the electrical paths.

The timing controller may be disposed in a manner that the driver of each display module of the plurality of display modules is symmetrically disposed with respect to the timing controller.

The plurality of micro LEDs may be arranged to have a 1:9 ratio of a first number of the plurality of micro LEDs arranged in a first direction of the first side surface and a second number of the plurality of micro LEDs arranged in a second direction of the third side surface.

The display apparatus may further include: an additional printed circuit board spaced apart from and parallel to the printed circuit board; and a plurality of additional display modules arranged adjacent in a second length direction of the additional printed circuit board.

The plurality of display modules and the plurality of additional display modules may be disposed opposite to each other.

Each of the plurality of display modules and each of the plurality of additional display modules may be disposed opposite to each other.

The plurality of display modules and the plurality of additional display modules may be disposed to be in contact with each other, respectively.

The plurality of display modules and the plurality of additional display modules may be arranged in a line, respectively.

At least one of 1:1, 16:9 or 21:9 may be a ratio in horizontal lengths of the plurality of display modules and vertical lengths of the plurality of display modules and the plurality of additional display modules.

The plurality of micro LEDs may include: a first micro LED emitting red light, a second micro LED emitting green light, and a third micro LED emitting blue light, the first to third micro LEDs forming one pixel of the display apparatus.

The display apparatus may further include: an arrangement plate configured to support the plurality of display modules and the plurality of additional display modules; and a housing configured to fix together the plurality of display modules, the plurality of additional display modules, and the arrangement plate.

Additional and/or other aspects and advantages of the disclosure will be set forth in part in the description which follows and, in part, will be obvious from the description, or may be learned by practice of the disclosure.

BRIEF DESCRIPTION OF THE DRAWING FIGURES

The above and/or other aspects of the disclosure will be more apparent by describing certain embodiments of the disclosure with reference to the accompanying drawings, in which.

DETAILED DESCRIPTION OF THE EMBODIMENTS

Figure 1:
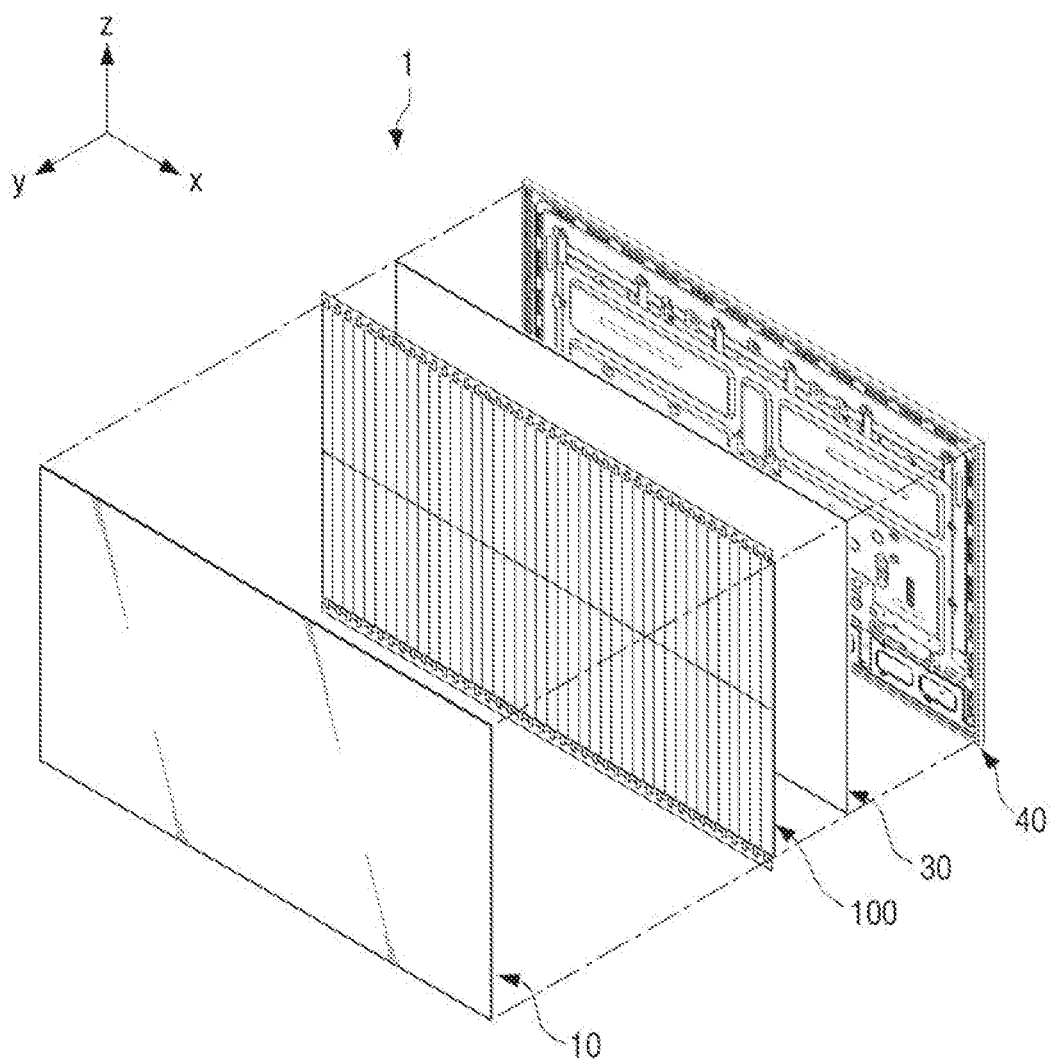
FIG. 1 is an exploded perspective view illustrating a display apparatus according to an embodiment of the disclosure.

Various advantages and features of the disclosure and methods accomplishing thereof will become apparent from the following description of embodiments with reference to the accompanying drawings. However, the disclosure may be modified in many different forms and it should not be limited to the embodiments set forth herein. These embodiments may be provided so that this disclosure will be thorough and complete, and will fully convey the scope of the disclosure to those skilled in the art. In the accompanying drawings, the components are enlarged in size rather than an actual size for convenience of description, and the ratio of each component may be exaggerated or reduced.

It is to be understood that in configuration that one component is referred to as being 'on' or 'connected to' another component, the one component may be directly on or directly connected to another component or may be indirectly connected to another component with a third component interposed therebetween. Whereas, it is to be understood that in configuration that one component is referred to as being 'directly on' or 'directly connected to' another component, the one component may be on or connected to another component without any intervening third component interposed therebetween. Other expressions describing a relationship between components, that is, "between," "directly between," and the like, should be similarly interpreted.

Terms such as 'first', 'second', etc., may be used to describe various components, but the components are not to be construed as being limited to the terms. The terms are used to distinguish one component from another component. For example, the 'first' component may be named the 'second' component and the 'second' component may also be similarly named the 'first' component, without departing from the scope of the disclosure.

Singular forms used herein are intended to include plural forms unless explicitly indicated otherwise. It is to be further understood that terms "include" or "comprise" specify the presence of features, numerals, steps, operations, components, parts, or combinations thereof mentioned in the specification, but do not preclude the addition of one or more other features, numerals, steps, operations, components, parts, or combinations thereof.

Unless indicated otherwise, the terms used in the embodiments have the same meaning as those that are usually understood by those who skilled in the art to which the disclosure pertains.

The display module according to an embodiment of the disclosure may be applied to an electronic product or an electronic device that requires a wearable device, a portable device, a handheld device, or various displays, in a single unit. The display module can also be applied to a small display device such as a monitor for a personal computer, a TV, etc. and a large display device such as a digital signage, an electronic display through a plurality of assembly arrangements.

Hereinafter, a configuration of a display apparatus 1 according to an embodiment of the disclosure is described with reference to FIG. 1.

FIG. 1 is an exploded perspective view illustrating a display apparatus according to an embodiment of the disclosure.

The display apparatus 1 may process an image signal obtained from an external source and visually display an image corresponding to the processed image signal. The display apparatus 1 may be implemented in various forms such as a television, a monitor, a portable multimedia device, a portable communication device and the like. However, the form of the display apparatus 1 is not limited to the above examples, and may be any apparatus capable of receiving, processing, and or displaying an image according to an image signal.

As illustrated in FIG. 1, the display apparatus 1 may include a protection plate 10, a display panel 100, an arrangement plate 30 and a housing 40.

The protection plate 10 may be disposed on a front surface (in Y-axis direction) of the display apparatus 1, and may protect the display panel 100 disposed behind the protection plate 10 from effects of an external environment outside of the display apparatus 1, such as dust, water, etc.

The protection plate 10 may be made of a glass material having a thin thickness and may be made of various materials according to protective characteristics, cost characteristics, or other characteristics desired of the protection plate 10.

The display panel 100 may emit light to display the image to be viewable from a front (the Y-axis direction) of the display apparatus 1 based on an image signal received from a source of the image signal.

The display panel 100 may be configured to include display screens of various sizes and shapes depending on arrangements, sizes, and quantities of display modules 110 and 120.

The display modules 110 and 120 can also be applied to a display device such as a monitor for a personal computer, a TV and digital signage, an electronic display through a plurality of assembly arrangements.

A detailed configuration of the display panel 100 is described below with reference to FIG. 2.

The arrangement plate 30 may be a plate on which the display panel 100 is disposed and may be disposed behind the display panel 100 as viewed from the front of the display apparatus 1. The arrangement plate 30 may be configured to be flat, and may be formed in various shapes and sizes depending on the shape and size of the display panel 100, such that a size of the arrangement plate may substantially correspond to the size of the display panel 100.

Accordingly, the arrangement plate 30 may be a backing configured to support the display panel 100 to be disposed in parallel on a same plane.

In detail, the arrangement plate 30 may support the plurality of display modules 110 and the plurality of additional display modules 120 configuring the display panel 100 to be arranged in parallel on the same plane.

Accordingly, the plurality of display modules 110 and the plurality of additional display modules 120 may have a same height and a display screen may thus have uniform luminance.

The housing 40 may form an exterior of the display apparatus 1, may be disposed behind the arrangement plate 30 as viewed from the front of the display apparatus 1, and may stably fix the plurality of display modules 110, the plurality of additional display modules 120 and the arrangement plate 30.

Accordingly, the housing 40 may prevent various components included in the display apparatus 1 from being exposed to an environment surrounding the display apparatus 1, and may protect the various components included in the display apparatus 1 from external impact or other damaging effects.

Hereinafter, a detailed configuration of the display panel 100 is described with reference to FIGS. 2 to 5.

Figure 2:
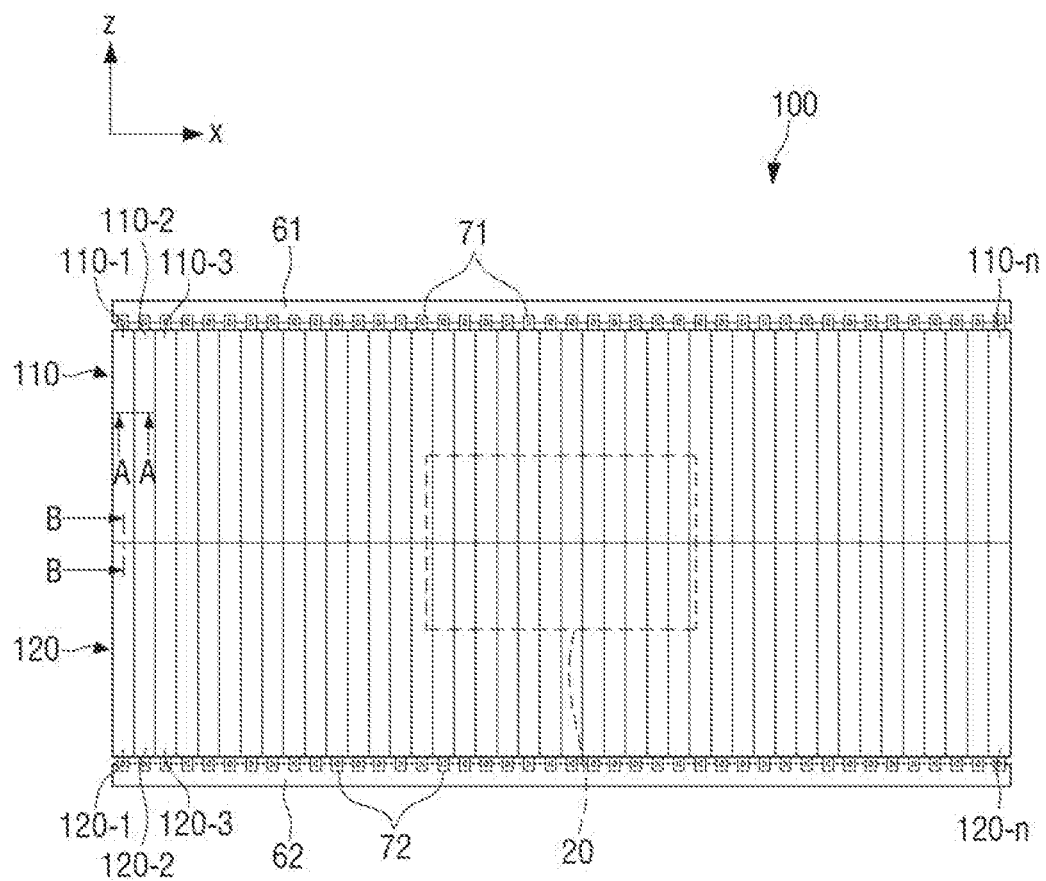
FIG. 2 is a front view illustrating a display panel according to an embodiment of the disclosure.
Figure 3:
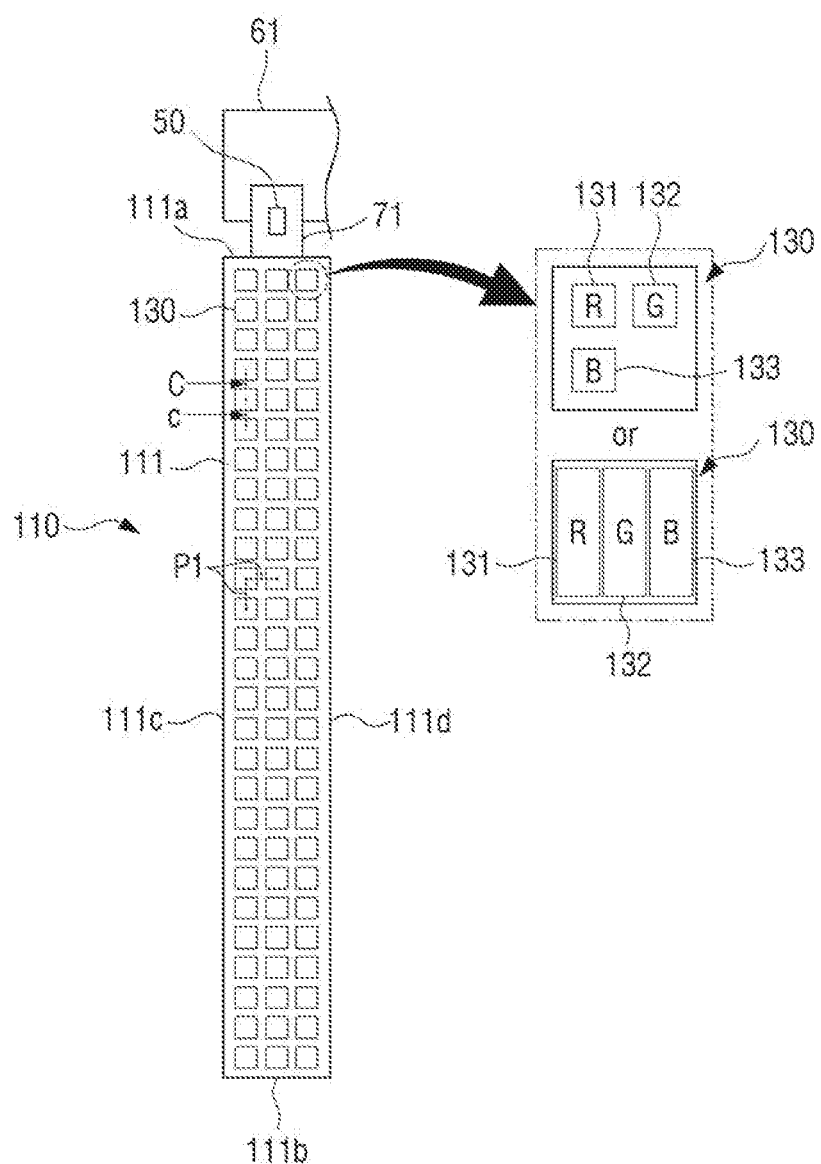
FIG. 3 is an enlarged view illustrating a display module according to an embodiment of the disclosure.
Figure 4:
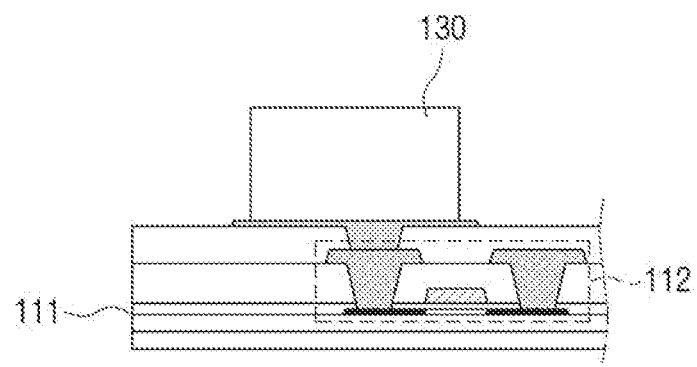
FIG. 4 is a cross-sectional view taken along a line C-C of FIG. 3.
Figure 5:
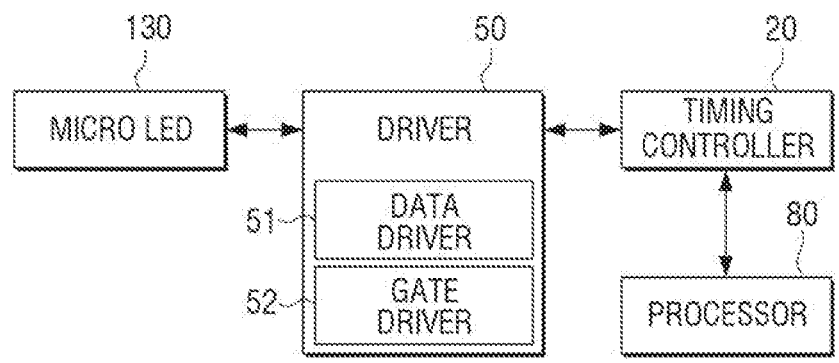
FIG. 5 is a block diagram illustrating a micro LED, a driver, a timing controller and a processor according to an embodiment of the disclosure.

FIG. 2 is a front view illustrating a display panel 100 according to an embodiment of the disclosure; FIG. 3 is an enlarged view illustrating one display module 110 according to an embodiment of the disclosure; FIG. 4 is a cross-sectional view taken along a line C-C of FIG. 3; and FIG. 5 is a block diagram illustrating a micro light emitting diode (LED) 130, a driver 50, a timing controller 20 and a processor 80 according to an embodiment of the disclosure.

Referring to FIG. 2, the display panel 100 may include: a printed circuit board 61; the plurality of display modules 110 continuously arranged in a length direction of the printed circuit board 61; an additional printed circuit board 62 spaced apart from and parallel to the printed circuit board 61; and the plurality of additional display modules 120 continuously arranged in a length direction of the additional printed circuit board 62.

Here, the length directions of the printed circuit board 61 and the additional printed circuit board 62 may refer to a direction (X-axis direction) in which each of the printed circuit board 61 and the additional printed circuit board 62 has a longer length.

First to n-th display modules 110-1 to 110-n having a same configuration may be continuously arranged in the length direction of the printed circuit board 61. Here, n may refer to a natural number.

Accordingly, the display screen implemented in the display panel 100 may be variously configured based on the number of arranged display modules 110 and a shape of each display module 110.

That is, a display screen of various sizes may be implemented through a simple manufacturing process of arranging the plurality of display modules 110, as each of the display modules 110-1 to 110-n among the plurality of display modules 110 may have a same configuration.

The printed circuit board (PCB) 61 may include electrical circuits patterned on a board, which acts as an insulator, and may be electrically and physically connected to the plurality of display modules 110 through a flexible printed circuit board (FPCB) 71.

Accordingly, the printed circuit board 61 may be electrically connected to the plurality of display modules 110, and a timing controller 20 and a processor 80, which are described below.

In addition, the printed circuit board 61 may transmit signals obtained from the timing controller 20 or the processor 80 to the plurality of display modules 110. Alternatively, the printed circuit board 61 may transmit signals obtained from the plurality of display modules 110 to the timing controller 20 or the processor 80.

In addition, the printed circuit board 61 may be formed in a shape of a rectangle having a length dimension that is longer than a width or height direction thereof. For example, the length of the printed circuit board 61 may correspond to a sum of the lengths of the plurality of display modules 110 arranged adjacent to the printed circuit board 61 in the length direction of the printed circuit board 61.

In addition, the plurality of display modules 110 may be continuously arranged in the length direction of the printed circuit board 61, and therefore the size of the printed circuit board 61 may be a criterion for arranging the plurality of display modules 110.

Referring to FIG. 3, each of the plurality of the display modules 110 may include: a thin film transistor substrate 111; a plurality of micro LEDs 130 arranged on a surface of the thin film transistor substrate 111; and the flexible printed circuit board (FPCB) 71 connecting the printed circuit board 61 to the thin film transistor substrate 111 and having one surface on which a driver 50 controlling the plurality of micro LEDs 130 is disposed.

The thin film transistor substrate 111 may stably fix the plurality of micro LEDs 130 arranged on one flat surface. Here, the thin film transistor substrate 111 may be formed to be any one of a glass substrate, a flexible substrate and a plastic substrate.

In detail, the thin film transistor substrate 111 may be formed to be a glass substrate onto which an electrode layer (or a thin film transistor (TFT) layer) including a plurality of thin film transistors 112 are coupled. Accordingly, the driver 50 driving the thin film transistor substrate 111 may be disposed and operated on the thin film transistor substrate 111 formed of a glass substrate and an electrode layer. That is, the chip-shaped driver 50 may be implemented in a form of a chip on glass (COG) on the thin film transistor substrate 111.

In addition, the thin film transistor substrate 111 may be formed to be a circuit board in which a circuit is formed on a flexible board. Accordingly, the driver 50 driving the thin film transistor substrate 111 may be disposed and operated on the thin film transistor substrate 111 formed as a circuit board. That is, the chip-shaped driver 50 may be implemented in a form of a chip on board (COB) on the thin film transistor substrate 111.

In addition, only the driver 50 may be disposed on the thin film transistor substrate 111; however, the driver 50 and also chip-shaped various components may be disposed on the thin film transistor substrate 111.

As illustrated in FIG. 4, the thin film transistor substrate 111 may include the plurality of thin film transistors 112 controlling and driving the plurality of micro LEDs 130 disposed on one surface thereof.

The thin film transistors 112 may be formed in the thin film transistor substrate 111, and may each thin film transistor 112 be electrically connected to one micro LED 130 disposed on a top surface of the thin film transistor substrate 111.

Accordingly, the thin film transistors 112 may each selectively drive the respective micro LEDs 130 by controlling a current flowing in the micro LED 130. That is, each of the thin film transistors 112 may serve as a switch controlling a pixel, and which may be a basic unit of a display.

In addition, the thin film transistor substrate 111 may have: a first side surface 111*a* disposed adjacent to the flexible printed circuit board 71; a second side surface 111*b* disposed opposite to the first side surface 111*a*; and third and fourth side surfaces 111*c* and 111*d* interposed and connecting between the first side surface 111*a* to the second side surface 111*b*, respectively, and formed to be longer than the first side surface 111*a* and the second side surface 111*b*.

That is, a shape of the thin film transistor substrate 111 may be rectangular having the first to fourth side surfaces 111*a*, 111*b*, 111*c* and 111*d*.

For example, the first side surface 111*a* and the second side surface 111*b* may be upper and lower ends of the thin film transistor substrate 111, respectively. In addition, the first and second side surfaces 111*a* and 111*b* may be side ends of the thin film transistor substrate 111 formed in parallel with the third and fourth side surfaces 111*c* and 111*d*, respectively.

Here, the first side surface 111*a* may be a side surface to which the printed circuit board 61 is adjacently disposed, and the second side surface 111*b* may be a side surface on which the printed circuit board 61 is not disposed.

The micro LED 130 may be formed of an inorganic light emitting material having dimensions of 100 μm or less in width, length, and height, and may be disposed on the thin film transistor substrate 111 to emit light by itself.

The micro LED 130 may form one pixel 130, and a first micro LED 131 emitting red light, a second micro LED 132 emitting green light and a third micro LED 133 emitting blue light, which may be sub-pixels, may be arranged in the one pixel 130.

The sub-pixels 131, 132 and 133 may be arranged in a matrix form or arranged sequentially in the one pixel 130. However, the above arrangement of the sub-pixels 131, 132 and 133 is merely exemplary, and the sub-pixels 131, 132 and 133 may be arranged with respect to each other in each one pixel 130 in various forms.

The micro LED 130 may have operational characteristics of a high response speed, low power, and high luminance. Additionally, the micro LED 130 may have a greater efficiency of converting electricity into photons than pixels of a conventional liquid crystal display (LCD) or organic light emitting diode (OLED).

Accordingly, the micro LED 130 may have higher "brightness per watt" than conventional LCD and OLED displays. As a result, the micro LED 130 may produce a brightness equivalent to that the conventional LED or OLED, but only utilizing half the energy or electricity.

In addition, the micro LED 130 may provide high resolution, excellent color, contrast and brightness, accurately express a wide range of colors, and implement a clear screen even in bright sunlight. Further, the micro LED 130 may be resilient against a burn-in phenomenon and may generate less heat, thereby ensuring a long durability without deformation.

The plurality of micro LEDs 130 disposed on one surface of the thin film transistor substrate 111 may be arranged to have a first pitch P1 or distance therebetween. That is, the plurality of micro LEDs 130 may be arranged to have the same first pitch P1 therebetween, and the plurality of micro LEDs 130 may thus implement uniform luminance of an entire display screen.

The driver 50 may be disposed on the flexible printed circuit board 71 to control the plurality of micro LEDs 130 arranged on one thin film transistor substrate 111 for each line.

The driver 50 may include a plurality of driver circuits, and each driver 50 may be disposed the flexible printed circuit board 71 or respectively disposed on flexible printed circuit boards.

Accordingly, the number of the drivers 50 may be equal to the number of the thin film transistor substrates 111. That is, one driver 50 may be disposed on one thin film transistor substrate 111.

In addition, referring to FIG. 5, the driver 50 may include a data driver 51 and a gate driver 52.

The data driver 51 may provide a control signal sequentially controlling a plurality of horizontal lines formed on a front surface of the thin film transistor substrate 111 by one line per one image frame, and may transmit the provided control signal to each of the micro LEDs 130 connected to a corresponding line.

The gate driver 52 may provide a control signal sequentially controlling a plurality of vertical lines formed on the front surface of the thin film transistor substrate 111 by one line per one image frame, and may transmit the provided control signal to each of the micro LEDs 130 connected to the corresponding line.

Accordingly, the plurality of micro LEDs 130 may be controlled using the data driver 51 and the gate driver 52.

The timing controller 20 may provide an image signal to the respective drivers 50 of the plurality of display modules 110. That is, the timing controller 20 may control the plurality of display modules 110 by controlling the plurality of drivers 50.

In detail, the timing controller 20 may obtain from the processor 80, an input signal IS, a horizontal synchronization signal Hsync, a vertical synchronization signal Vsync, a main clock signal MCLK and the like; may provide an image data signal, a scan control signal, a data control signal, a light emission control signal, etc. of the first to third micro LEDs 131, 132 and 133; and may provide these signals on the driver 50.

In addition, to control the luminance of each of the first to third micro LEDs 131, 132 and 133, the timing controller 20 may use at least one of a pulse width modulation (PWM) technique in which a duty ratio of a driving current (Id) is varied or a pulse amplitude modulation (PAM) technique in which an amplitude of the driving current (Id) is varied.

For example, with configuration of the pulse width modulated (PWM) signal, the micro LED 130 may emit light with higher luminance as the duty ratio (or driving time) of the driving current is longer, and the duty ratio (%) may be determined based on a dimming value input from the processor 80.

Meanwhile, with configuration of the pulse amplitude modulation (PAM) signal, the micro LED 130 may emit light with high luminance as the amplitude of the driving current is increased. Through this configuration, various colors and gradations of an image may be expressed.

The processor 80 may be disposed on one side of the display apparatus 1 and transmit a command signal driving for controlling the plurality of micro LEDs 130 to the timing controller 20.

Here, the processor 80 may include at least one of a central processing unit (CPU), a controller, an application processor (AP), a communication processor (CP), or an Advanced RISC Machines (ARM) processor.

Referring to FIG. 3, the flexible printed circuit board 71 may include a conductive circuit having a good electrical conductivity and formed on an insulator made of a flexible material, and may connect the printed circuit board 61 and the thin film transistor substrate 111 to each other. The driver 50 may be disposed on one surface of the flexible printed circuit board 71.

In detail, the flexible printed circuit board 71 may be disposed on the first side surface 111*a* of the thin film transistor substrate 111, and may electrically and physically connect the thin film transistor substrate 111 and the printed circuit board 61 to each other.

Accordingly, the driver 50 driving the plurality of micro LEDs 130 may be disposed on the first side surface 111*a* of the thin film transistor substrate 111. In this manner, distances between the plurality of display modules 110 may be minimized or eliminated, and thus a virtually seamless and bezelless display screen may be implemented.

In addition, the driver 50 need not to be disposed on a rear surface of the thin film transistor substrate 111 to implement such a seamless display screen. Therefore, a simple configuration may be realized and manufacturing costs may be reduced.

That is, the driver 50 driving the plurality of micro LEDs 130 may be disposed on the first side surface 111*a* of the thin film transistor substrate 111. Due to this configuration, the plurality of display modules 110 may be simply and sequentially arranged in the length direction of the printed circuit board 61 to implement the display screen.

In addition, a plurality of flexible printed circuit boards 71 may be formed, and each of the flexible printed circuit boards 71 may be disposed on the first side surface 111*a* of one thin film transistor substrate 111.

Accordingly, the number of the flexible printed circuit boards 71 may be equal to the number of the thin film transistor substrates 111.

That is, one display module 110 may be configured as one unit including one thin film transistor substrate 111 on which the plurality of micro LEDs 130 are arranged, one flexible printed circuit board 71 disposed on the first side surface 111*a* of the thin film transistor substrate 111, and one driver 50 disposed on one surface of one flexible printed circuit board 71.

Hereinafter, a detailed arrangement configuration of the display panel 100 is described with reference to FIGS. 2, 6A and 6B.

Figure 6A:
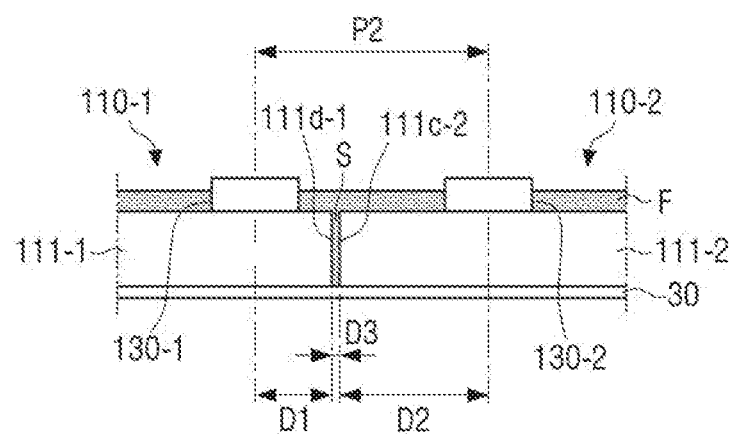
FIG. 6A is a cross-sectional view taken along a line A-A of FIG. 2.
Figure 6B:
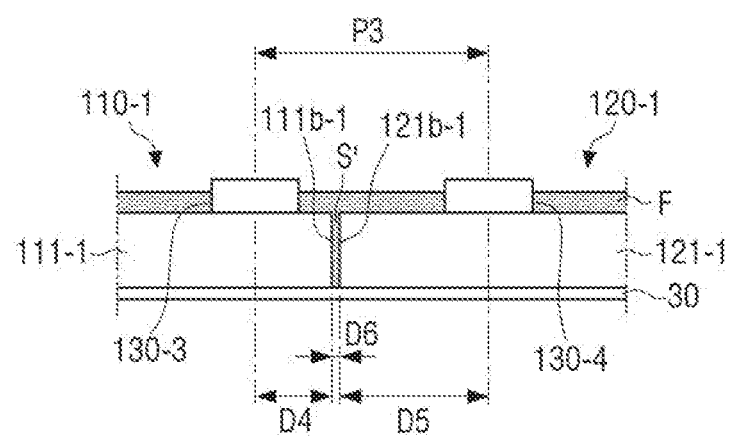
FIG. 6B is a cross-sectional view taken along a line B-B of FIG. 2.

FIG. 6A is a cross-sectional view taken along a line A-A of FIG. 2; and FIG. 6B is a cross-sectional view taken along a line B-B of FIG. 2.

Referring to FIG. 2, the plurality of display modules 110 may be sequentially arranged in the length direction of the printed circuit board 61. Here, the plurality of display modules 110 may all have a same configuration.

In detail, the plurality of display modules 110, i.e. identical display modules 110-1 to 110-*n* may be continuously arranged along one end of the printed circuit board 61.

For example, a second display module 110-2 having the same configuration as a first display module 110-1 may be disposed on a side of the first display module 110-1. Similarly, a third display module 110-3 having the same configuration as the second display module 110-2 may be disposed on a side of the second display module 110-2. Thus, display modules 110-1 to 110-*n* may be sequentially disposed adjacent to each other.

In this manner, an n-th display module 110-*n* may be disposed at an end opposite to the end of the printed circuit board 61 at which the first display module 110-1 is disposed.

In other words, the first to n-th display modules may be sequentially arranged in the length direction of the printed circuit board 61. Accordingly, the display screen may be implemented using the plurality of display modules 110 all having the same configuration, and the manufacturing cost of the display apparatus 1 may thus be significantly reduced.

Here, the third side surface 111*c* and the fourth side surface 111*d* of the plurality of display modules 110 may be arranged parallel to each other, respectively. Accordingly, the plurality of display modules 110 may be arranged in parallel to each other, horizontal and vertical distances and arrangement between the plurality of micro LEDs 130 included in the plurality of display modules 110 may be uniform, and therefore the display apparatus 1 may implement uniform luminance.

In detail, as illustrated in FIG. 6A, a first thin film transistor substrate 111-1 of the first display module 110-1 and a second thin film transistor substrate 111-2 of the second display module 110-2 may be disposed in parallel to each other.

In more detail, a fourth side surface 111*d*-1 of the first thin film transistor substrate 111-1 and a third side surface 111*c*-2 of the second thin film transistor substrate 111-2 may be disposed parallel to each other with a separation space S having a third distance D3.

Accordingly, a first outermost micro LED 130-1 disposed at the outermost of the first thin film transistor substrate 111-1 may be disposed to have a second pitch P2 from a second outermost micro LED 130-2 disposed at the outermost of the second thin film transistor substrate 111-2.

Here, the second pitch P2 may be equal to a sum of: a first distance D1, which is a distance between the fourth side surface 111*d*-1 of the first thin film transistor substrate 111-1 and the first outermost micro LED 130-1; a second distance D2, which is a distance between the third side surface 111*c*-2 of the second thin film transistor substrate 111-2 and the second outermost micro LED 130-2; and the third distance D3 of the separation space S.

In addition, the second pitch P2 may be equal to the first pitch P1, which is a distance between the plurality of micro LEDs 130 arranged on one thin film transistor substrate 111.

Accordingly, even in a configuration that the plurality of display modules 110-1 and 110-2 are arranged together, all the distances between the plurality of micro LEDs 130 may be equal to each other. The display screen may thus implement uniform luminance and have the perception of seamlessness at the same time.

Meanwhile, a non-conductive resin composition F containing a black pigment for shielding may fill the separation space S. Accordingly, even in a configuration that the separation space S is formed between the plurality of display modules 110, a seam may be substantially unperceivable as viewed from the outside of the display apparatus 1 by a viewer.

In addition, among the plurality of display modules, the third side surface 111c of one display module may be in contact with the fourth side surface 111d of an adjacent display module.

For example, the third side surface 111c-2 of the second display module 110-2 may be in contact to abut with the fourth side surface 111d-1 of the first display module 110-1, which is adjacent to the second display module 110-2.

Accordingly, the separation space S may not be formed between the first display module 110-1 and the second display module 110-2, thereby implementing seamlessness between the plurality of display modules.

Meanwhile, referring again to FIG. 2, the additional printed circuit board 62 may be disposed to be spaced apart from and in parallel with the printed circuit board 61. The additional printed circuit board 62 has the same configuration as the above-described printed circuit board 61, and thus a redundant description thereof is omitted.

The additional display modules 120 may be sequentially arranged in a length direction of the additional printed circuit board 62. Here, with the exception of disposition on the additional printed circuit board 62, the additional display modules 120 have the same configuration as the above-described display modules 110, respectively, and thus a redundant description thereof is omitted.

Referring to FIG. 2, the plurality of additional display modules 120 may be sequentially arranged in the length direction of the additional printed circuit board 62. Here, all the plurality of additional display modules 120 may have the same configuration.

In detail, the plurality of additional display modules 120, i.e. identical additional display modules 120-1 to 120-n may be continuously arranged along one end of the printed circuit board 62.

For example, a second additional display module 120-2 having the same configuration as a first additional display module 120-1 may be disposed on a side of the first additional display module 120-1. Similarly, a third additional display module 120-3 having the same configuration as the second additional display module 120-2 may be disposed on a side of the second additional display module 120-2.

In this manner, an n-th additional display module 120-n may be disposed at an end opposite to the end of the additional printed circuit board 62 at which the first additional display module 120-1 is disposed. Here, n may refer to a natural number.

The plurality of additional display modules 120 may be disposed opposite to the plurality of display modules 110, respectively. That is, as illustrated in FIG. 2, one display screen may be implemented by arranging the plurality of display modules 110 and the plurality of additional display modules 120 between the printed circuit board 61 and the additional printed circuit board 62.

Accordingly, the one display screen may be implemented by arranging the plurality of display modules 110 and the plurality of additional display modules 120, which are manufactured in the same manner.

In addition, the display screen may be implemented by simply arranging the plurality of display modules 110 and the plurality of additional display modules 120, which are manufactured in the same manner, to have a changed arrangement direction and the arrangement column. Therefore, the display panel 100 may have a simplified manufacturing process.

In addition, the plurality of display modules 110 and the plurality of additional display modules 120 may be disposed opposite to each other, respectively.

For example, as illustrated in FIG. 6B, the first thin film transistor substrate 111-1 of the first display module 110-1 and a first additional thin film transistor substrate 121-1 of the first additional display module 120-1 may be disposed in alignment with each other.

In more detail, a second side surface 111b-1 of the first thin film transistor substrate 111-1 and a second side surface 121b-1 of the first additional thin film transistor substrate 121-1 may be disposed in an alignment parallel to oppose each other.

Here, first side surfaces 111a-1 and 121a-1 may refer to side surfaces to which the printed circuit board 61 and the additional printed circuit board 62 are adjacently disposed, respectively; and the second side surfaces 111b-1 and 121b-1 may refer to side surfaces on which the printed circuit board 61 and the additional printed circuit board 62 are not disposed, respectively.

That is, the second side surfaces 111b of the plurality of display modules 110 may be disposed to correspond to second side surfaces 121b of the plurality of additional display modules 120, respectively.

Accordingly, the plurality of display modules 110 and the plurality of additional display modules 120 may be arranged to implement a cohesive display screen.

In addition, the second side surface 111b-1 of the first thin film transistor substrate 111-1 and the second side surface 121b-1 of the first additional thin film transistor substrate 121-1 may be disposed parallel to each other with a separation space S'.

Accordingly, a third outermost micro LED 130-3 disposed at the outermost of the first thin film transistor substrate 111-1 may be disposed to have a third pitch P3 from a fourth outermost micro LED 130-4 disposed at the outermost of the first additional thin film transistor substrate 121-1.

Here, the third pitch P3 may be equal to a sum of: a fourth distance D4, which is a distance between the second side surface 111b-1 of the first thin film transistor substrate 111-1 and the third outermost micro LED 130-3; a fifth distance D5, which is a distance between the second side surface 121b-1 of the first additional thin film transistor substrate 121-1 and the fourth outermost micro LED 130-4; and a sixth distance D6 of the separation space S'.

In addition, the third pitch P3 may be equal to the first pitch P1, which is a distance between the plurality of micro LEDs 130 arranged on one thin film transistor substrate 111.

Accordingly, even in a configuration that the plurality of display modules 110 and the plurality of additional display modules 120 are arranged together, all the distances between the plurality of micro LEDs 130 may be equal to each other.

The display screen may thus implement uniform luminance and have the perception of seamlessness at the same time.

Meanwhile, the non-conductive resin composition F containing a black pigment for shielding may fill the separation space S'. Accordingly, even in configuration that the separation space S' is formed between the plurality of display modules 110 and the plurality of additional display modules 120, a seam may be unperceivable from the perspective of a viewer of the display apparatus.

In addition, the plurality of display modules 110 and the plurality of additional display modules 120 may be disposed to be in contact with each other, respectively. That is, the plurality of display modules 110 and the plurality of additional display modules 120 may be disposed in abutment not to form the separation space S' therebetween, respectively.

Accordingly, the plurality of display modules 110 and the plurality of additional display modules 120 may implement the seamless, cohesive display screen.

In addition, the plurality of display modules 110 and the plurality of additional display modules 120 may be arranged in an aligned configuration, respectively.

For example, as illustrated in FIG. 2, the first display module 110-1 may be disposed parallel to the first additional display module 120-1, and the second display module 110-2 may be disposed in a line with the second additional display module 120-2.

Similarly, an n-th display module 110-n may be disposed in a line with the n-th additional display module 120-n. Here, n may refer to a natural number. Accordingly, the number of the plurality of display modules 110 and that of the plurality of additional display modules 120 may be equal to each other.

The plurality of display modules 110 and the plurality of additional display modules 120 may be arranged in a line, respectively, and the display apparatus 1 may thus implement a rectangular shaped display screen.

In addition, physical and signal differences between the display modules adjacent to each other may be minimized to correspondingly minimize line mura between the display modules.

Hereinafter, an operation of the display panel 100 according to an embodiment of the disclosure is described with reference to FIGS. 7A and 7B.

Figure 7A:
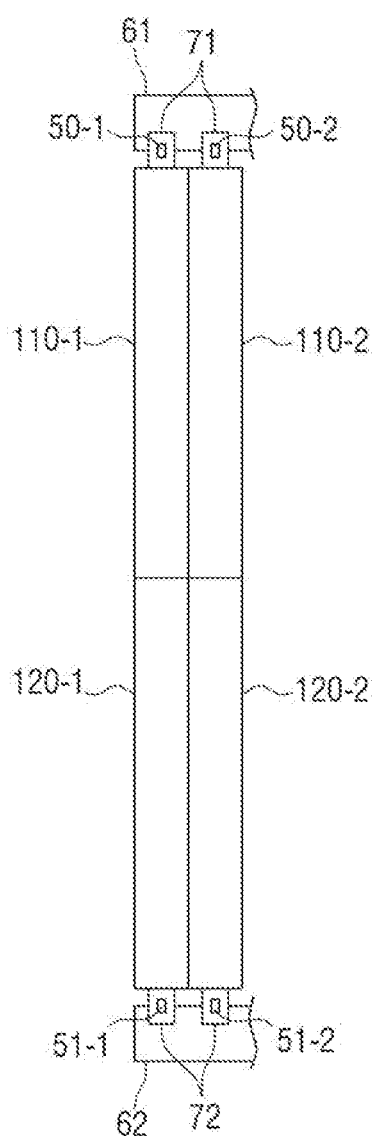
FIGS. 7A and 7B are enlarged views illustrating display modules showing operations of the plurality of display modules.
Figure 7B:
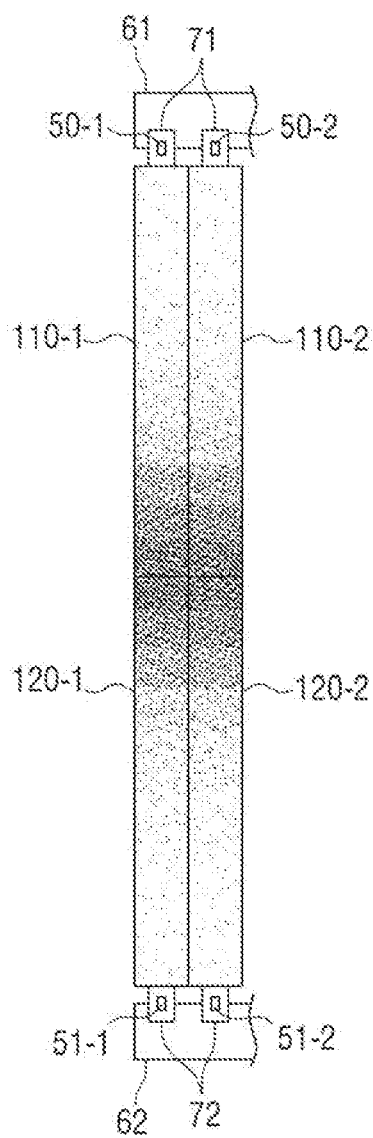

FIGS. 7A and 7B are enlarged views illustrating some display modules 110-1, 110-2, 120-1 and 120-2 showing operations of the plurality of display modules 110.

As illustrated in FIG. 7A, the plurality of display modules 110 and the plurality of additional display modules 120 may be arranged adjacent to and opposite to each other, in which the printed circuit board 61 and the additional printed circuit board 62 may be disposed on upper and lower ends (i.e. first side surfaces) of the plurality of display modules 110 and the plurality of additional display modules 120, respectively.

Thereafter, the processor 80 may simultaneously transmit one display screen signal to the printed circuit board 61 and the additional printed circuit board 62. The printed circuit board 61 may transmit the signal to the plurality of display modules 110, and the additional printed circuit board 62 may transmit the signal to the plurality of additional display modules 120.

That is, one processor 80 may transmit a signal to timing controller 20, and the timing controller 20 may propagate the signal to the printed circuit board 61 and the additional printed circuit board 62, thereby implementing a unified display screen.

For example, the signal transmitted to the printed circuit board 61 may be simultaneously transmitted to a first driver 50-1 and a second driver 50-2, which are disposed on the flexible printed circuit board 71; and the signal transmitted to the additional printed circuit board 62 may be simultaneously transmitted to a first additional driver 51-1 and a second additional driver 51-2, which are disposed on an additional flexible printed circuit board 72.

Here, the additional drivers 51-1 and 51-2 may have the same configuration as the above-described drivers 50, 50-1 and 50-2, and thus a redundant description thereof is omitted.

Thereafter, the first driver 50-1 may operate the first display module 110-1, and the second driver 50-2 may operate the second display module 110-2. Simultaneously, the first additional driver 51-1 may operate the first additional display module 120-1, and the second additional driver 51-2 may operate the second additional display module 120-2.

Here, the signal may be more rapidly transmitted to the side surfaces of the display modules disposed closer to the drivers thereof, respectively. Therefore, the signal may be transmitted slightly slower to surfaces (i.e. the second side surfaces) on which the plurality of display modules 110 and the plurality of additional display modules 120 are adjacent to each other.

However, even in this configuration, the plurality of display modules 110 and the plurality of additional display modules 120 may be arranged symmetrical to each other, and thus the signal may also be evenly transmitted.

As such, the signal is transmitted symmetrically and therefore, a difference may not be apparent in the signal transmission near the surfaces (i.e. the second side surfaces) on which the plurality of display modules 110 and the plurality of additional display modules 120 are adjacent to each other.

That is, such an arrangement configuration of the plurality of display modules 110 and the plurality of additional display modules 120 may improve efficiency of the signal transmission.

For example, as illustrated in FIG. 7B, in configuration that a signal transmitted from a display screen is a signal indicating luminance, the plurality of display modules 110 and the plurality of additional display modules 120, which are disposed adjacent to the printed circuit board 61 and the additional printed circuit board 62, respectively, may appear white.

In addition, the signal may be more slowly transmitted to the side surfaces of the display modules disposed farther from the printed circuit board 61 and the additional printed circuit board 62, respectively. Thus, the plurality of display modules 110 and the plurality of additional display modules 120 may appear black.

However, even in this configuration, the plurality of display modules 110 and the plurality of additional display modules 120 may be arranged symmetrically and accordingly, a user may not recognize any difference in luminance between the plurality of display modules 110 and the plurality of additional display modules 120.

In addition, the plurality of display modules 110 and the plurality of additional display modules 120 may implement a same level of luminance and accordingly, the user may not recognize a seam between the plurality of display modules 110 and the plurality of additional display modules 120. Therefore, the display screen may implement seamlessness through a signal control.

That is, one display screen may be implemented through such a configuration of the plurality of display modules 110 and the plurality of additional display modules 120 to have a simplified manufacturing process, seamlessness, and improved efficiency of the signal transmission.

Hereinafter, a detailed configuration of the timing controller 20 is described with reference to FIG. 8.

Figure 8:
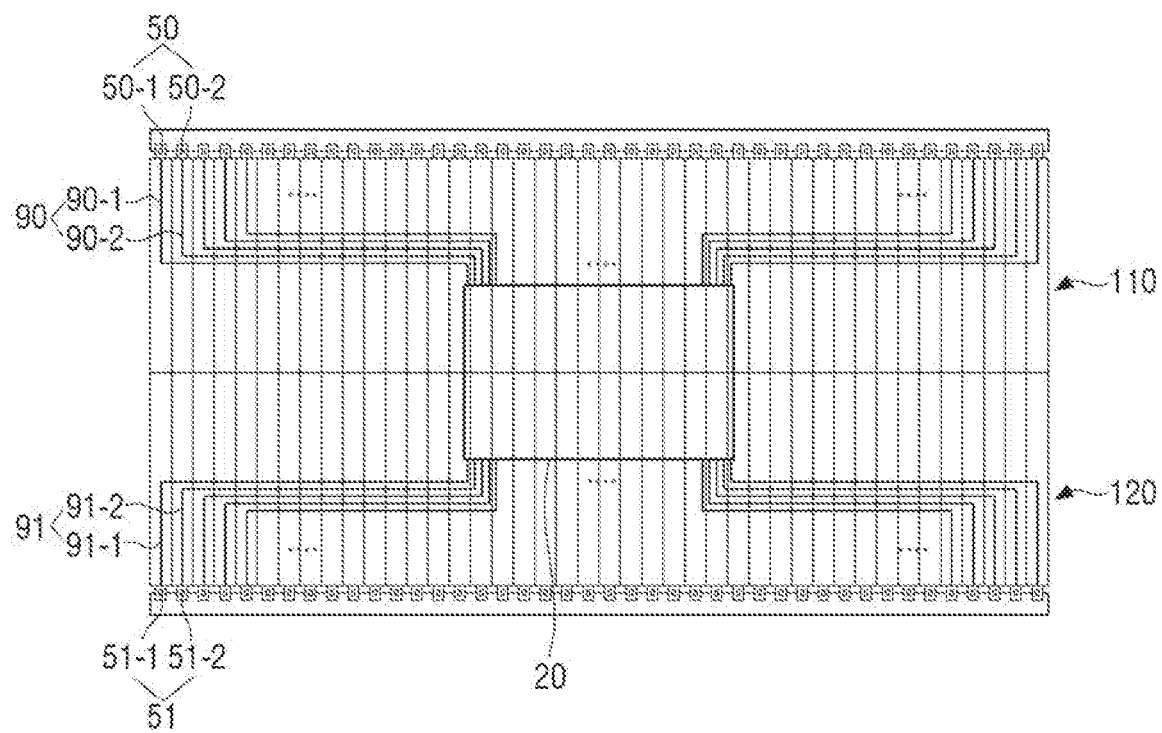
FIG. 8 is a front view illustrating a connection between a plurality of display modules and a timing controller.

FIG. 8 is a front view illustrating a connection between display modules 110 and 120 and a timing controller 20.

The timing controller 20 may be connected to the driver 50 and the additional driver 51 through electrical paths 90 and 91.

Here, the electrical paths 90 and 91 may refer to shortest paths among the timing controller 20, the driver 50 and the additional driver 51. In addition, the timing controller 20 may not be limited to being directly connected to the driver 50 and the additional driver 51, and may be connected to the driver 50 and the additional driver 51 through the printed circuit board 61 and the additional printed circuit board 62.

Accordingly, a signal transmitted from one timing controller 20 may be transmitted to the driver 50 and the additional driver 51 through the plurality of electrical paths 90 and 91, and may control and operate the plurality of display modules 110 and the plurality of additional display modules 120.

The number of electrical paths 90, 91 may be equal to the number of drivers 50 and additional drivers 51.

The timing controller 20 may be disposed at a center portion of the rear of the plurality of display modules 110 and the plurality of additional display modules 120.

In addition, the timing controller 20 may be disposed to minimize a sum of distances between the timing controller 20 and the respective drivers 50 of the plurality of display modules 110. In addition, the timing controller 20 may be disposed to minimize a sum of distances between the timing controller 20 and the respective additional drivers 51 of the plurality of additional display modules 120. Thereby, each port of a plurality of ports of the timing controller is connected to the driver of each display module of the plurality of display modules through electrical paths and the timing controller is disposed to minimize a sum of lengths of the electrical paths.

In addition, the timing controller 20 may be disposed in a manner that the respective drivers 50 of the plurality of display modules 110 are symmetrical to each other with respect to the timing controller 20.

Similarly, the timing controller 20 may be disposed in a manner that the respective drivers 50 of the plurality of display modules 110 and the respective additional drivers 51 of the plurality of additional display modules 120 are symmetrical to each other with respect to the timing controller 20.

Accordingly, considering that each length of the electrical paths 90 and 91 is proportional to a resistance of the signal, the timing controller 20 may transmit the same signal to all the drivers 50 and the additional drivers 51 through the electrical paths 90 and 91 having the same length without any loss of signal.

Therefore, one display screen may be controlled by disposing one timing controller 20 instead of a plurality of timing controllers.

That is, the drivers 50 controlling the plurality of display modules 110 and the additional drivers 51 controlling the plurality of additional display modules 120 may be disposed symmetrically to each other. Therefore, only one timing controller 20 may be arranged to control all of the drivers 50 and the additional drivers 51, which are disposed in the display apparatus 1.

Therefore, a utilization rate of the timing controller 20 may be maximized. As such, one timing controller 20 may be used, thereby reducing the manufacturing cost and process thereof.

Hereinafter, the display panels 100 of various sizes are described with reference to FIG. 3 and FIG. 9.

Figure 9:
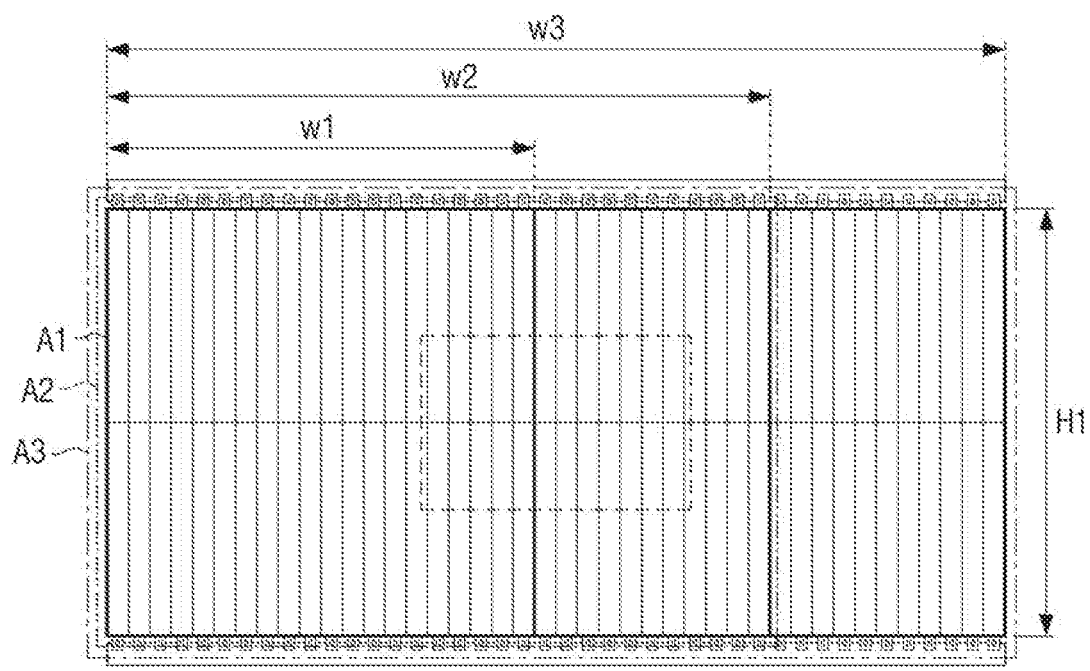
FIG. 9 is a front view illustrating various display regions of FIG. 2.

FIG. 9 is a front view illustrating various display regions of FIG. 2.

The plurality of micro LEDs 130 may be arranged to have a 1:9 ratio in the number of micro LEDs arranged in a length direction of the first side surface 111a and the number of micro LEDs arranged in a length direction of the third side surface 111c.

Accordingly, at least one of 1:1, 16:9 or 21:9 may be a ratio in horizontal lengths W1, W2 and W3 of the plurality of display modules 110 and vertical lengths H1 of the plurality of display modules 110 and the plurality of additional display modules 120.

For example, the plurality of micro LEDs 130 may implement a forward display screen A1 of 1:1 in configuration that: 1:9 is the ratio of the number of micro LEDs arranged in the length direction of the first side surface 111a and the number of micro LEDs arranged in the length direction of the third side surface 111c; and the display module 110 and the additional display module 120 of 18 columns are arranged in a length direction of the printed circuit board 61.

Similarly, the plurality of micro LEDs 130 may implement a 4 k or 8 k display screen A2 of 16:9, in configuration that: 1:9 is the ratio in the number of micro LEDs arranged in the length direction of the first side surface 111a and the number of micro LEDs arranged in the length direction of the third side surface 111c; and the display module 110 and the additional display module 120 of 32 columns are arranged in the length direction of the printed circuit board 61.

In addition, the plurality of micro LEDs 130 may implement a cinema display screen A3 of 21:9 in configuration that: 1:9 is the ratio in the number of micro LEDs arranged in the length direction of the first side surface 111a and the number of micro LEDs arranged in the length direction of the third side surface 111c; and the display module 110 and the additional display module 120 of 42 columns are arranged in the length direction of the printed circuit board 61.

That is, in a configuration that 1:9 is the ratio in the number of micro LEDs arranged in horizontal and vertical directions, the plurality of micro LEDs 130 may implement display screens of various sizes by producing the display module 110 having the same configuration and changing only the number of arranged display modules.

Therefore, the display panels 100 of various sizes may be produced at a greatly reduced manufacturing cost.

Hereinafter, a configuration of the display panel according to another embodiment of the disclosure is described with reference to FIG. 10.

Figure 10:
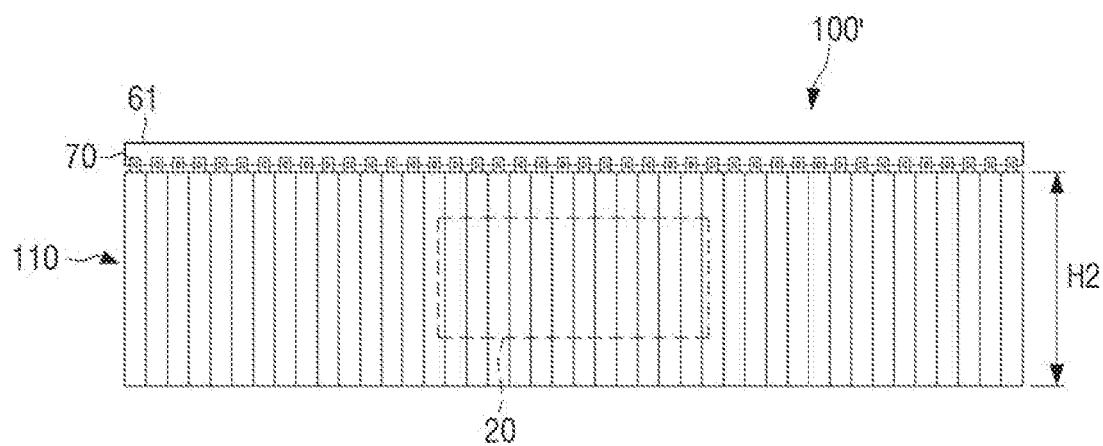
FIG. 10 is a front view illustrating a display panel according to another embodiment of the disclosure.

FIG. 10 is a front view illustrating a display panel 100' according to another embodiment of the disclosure.

Here, the same reference numeral is used to refer to the same component, as described above. The timing controller 20, the printed circuit board 61, the flexible printed circuit board 70 and the plurality of display modules 110 have the same configuration as described above, and thus redundant descriptions thereof are omitted.

Different from the former embodiment, the display panel 100' may be configured as one unit including the printed circuit board 61 and a plurality of display modules 110 sequentially arranged in the length direction of the printed circuit board 61.

That is, the display panel 100' may be implemented without arranging the additional printed circuit board 62 and the plurality of additional display modules 120 thereon.

Accordingly, as the display panel 100' having minimum components, the display panel 100' may be implemented to have a second height H2. Therefore, the display panels 100' of various sizes may be formed according to the configuration according to the disclosure.

Hereinabove, although diverse embodiments of the disclosure are individually described, each of the embodiments is not necessarily implemented alone, and the configuration and operation of each of the embodiments may be implemented in combination with at least one other embodiments.

In addition, although embodiments in the disclosure have been illustrated and described hereinabove, the disclosure is not limited to the above mentioned specific embodiments, but may be variously modified by those skilled in the art to which the disclosure pertains without departing from the gist in the disclosure as disclosed in the accompanying claims. These modifications should also be understood to fall within the scope and spirit in the disclosure.

What is claimed is:

1. A display apparatus comprising:
    a first printed circuit board arranged at a first edge of the display apparatus in a width direction of the display apparatus;
    a first plurality of display modules arranged adjacent in a length direction of the display apparatus, wherein each first display module of the first plurality of display modules comprises:
        a first thin film transistor substrate;
        a first plurality of micro light emitting diodes (LEDs) arranged on a first surface of the first thin film transistor substrate;
        a first flexible printed circuit board (FPCB) connecting the first printed circuit board to the first thin film transistor substrate; and
        a first driver controlling the first plurality of micro LEDs, the first driver being disposed on a first surface of the first FPCB;
    a second printed circuit board disposed at a second edge of the display apparatus in the width direction of the display apparatus; and
    a second plurality of display modules arranged adjacent in the length direction of the display apparatus, wherein each second display module of the second plurality of display modules comprises:
        a second thin film transistor substrate;
        a second plurality of micro light emitting diodes (LEDs) arranged on a first surface of the second thin film transistor substrate;
        a second flexible printed circuit board (FPCB) connecting the second printed circuit board to the second thin film transistor substrate; and
        a second driver controlling the second plurality of micro LEDs, the second driver being disposed on a first surface of the second FPCB, and
    wherein first edges of the first plurality of display modules are aligned with second edges the second plurality of display modules in the width direction of the display apparatus.

2. The display apparatus as claimed in claim 1, wherein a first shape of the first thin film transistor substrate and a second shape of the second thin film transistor substrate are rectangular including a first side surface, a second side surface, a third side surface, and a fourth side surface,
    wherein the first side surface of the first thin film transistor substrate is disposed adjacent to the first flexible printed circuit board and the first side surface of the second thin film transistor substrate is disposed adjacent to the second flexible printed circuit board, and
    wherein a third length of the third side surface and a fourth length of the fourth side surface is longer than a first length of the first side surface and a second length of the second side surface.

3. The display apparatus as claimed in claim 2, wherein the third side surface of each first display module is arranged parallel to each other and the third side surface of each second display module is arranged parallel to each other.

4. The display apparatus as claimed in claim 3, wherein the third side surface of a first display module among the first plurality of display modules is in contact with the fourth side surface of a second display module among the first plurality of display modules adjacent to the first display module, and
    wherein the third side surface of a third display module among the second plurality of display modules is in contact with the fourth side surface of a fourth display module among the second plurality of display modules adjacent to the third display module.

5. The display apparatus as claimed in claim 2, wherein the first plurality of micro LEDs and the second plurality of micro LEDs are arranged to have a 1:9 ratio of a first number of the first plurality of micro LEDs and a second number of the second plurality of micro LEDs.

6. The display apparatus as claimed in claim 1, further comprising a timing controller configured to provide an image signal to the first driver of each first display module and the second driver of each second display module.

7. The display apparatus as claimed in claim 6, wherein the timing controller is disposed behind the first plurality of display modules and the second plurality of display modules.

8. The display apparatus as claimed in claim 7, wherein the timing controller is disposed at a center portion of the display apparatus.

9. The display apparatus as claimed in claim 7, wherein respective ports of a plurality of ports of the timing controller are connected to the first driver of each first display module and the second driver of each second display module through electrical paths, and
    wherein the timing controller is disposed to minimize a sum of lengths of the electrical paths.

10. The display apparatus as claimed in claim 7, wherein the timing controller is disposed in a manner that the first driver of each first display module and the second driver of each second display module is symmetrically disposed with respect to the timing controller.

11. The display apparatus as claimed in claim 1, wherein the first printed circuit board is parallel to the second printed circuit board, and
    wherein the first edges of the first plurality of display modules are adjacent to the second edges of the second plurality of display modules in the width direction display apparatus.

12. The display apparatus as claimed in claim 11, wherein the first edges of the first plurality of display modules are disposed to be in contact with the second edges of the second plurality of display modules.

13. The display apparatus as claimed in claim 11, wherein first horizontal lengths of the first plurality of display modules and second horizontal lengths of the second plurality of display modules and first vertical lengths of the first plurality of display modules and second vertical lengths of the second plurality of display modules are in a ratio of 1:1, 16:9, or 21:9.

14. The display apparatus as claimed in claim 11, further comprising:
- an arrangement plate configured to support the first plurality of display modules and the second plurality of display modules; and
- a housing configured to fix together the first plurality of display modules, the second plurality of display modules, and the arrangement plate.

15. The display apparatus as claimed in claim 1, wherein the first plurality of micro LEDs and the second plurality of micro LEDs comprise:
- a first micro LED emitting red light,
- a second micro LED emitting green light, and
- a third micro LED emitting blue light, and
- wherein the first micro LED, the second micro LED, and the third micro LED form one pixel of the display apparatus.

\* \* \* \* \*